United States Patent
Ohuchi et al.

(10) Patent No.: US 6,791,106 B2
(45) Date of Patent: Sep. 14, 2004

(54) SEMICONDUCTOR DEVICE AND METHOD OF MANUFACTURING THE SAME

(75) Inventors: Kazuya Ohuchi, Kanagawa (JP); Hironobu Fukui, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/420,884

(22) Filed: Apr. 23, 2003

(65) Prior Publication Data

US 2003/0201493 A1 Oct. 30, 2003

Related U.S. Application Data

(63) Continuation-in-part of application No. 10/084,221, filed on Feb. 28, 2002.

(30) Foreign Application Priority Data

Dec. 26, 2001 (JP) ..................................... 2001-394215
Dec. 25, 2002 (JP) ..................................... 2002-373954

(51) Int. Cl.$^7$ ...................... H01L 29/06; H01L 31/119; H01L 29/167
(52) U.S. Cl. .................. 257/19; 257/388; 257/412; 257/151; 257/407; 257/616; 257/611; 257/607; 257/402; 257/20; 257/364
(58) Field of Search ................... 257/19, 388, 412, 257/151, 407, 616, 611, 607, 402, 20, 364

(56) References Cited

U.S. PATENT DOCUMENTS 6,630,720 B1 * 10/2003 Maszara et al. ............ 257/407
2003/0146494 A1 * 8/2003 Puchner et al. ............ 257/616

* cited by examiner

*Primary Examiner*—Jerome Jackson
*Assistant Examiner*—Joseph Nguyen
(74) *Attorney, Agent, or Firm*—Oblon, Spivak, McClelland, Maier & Neustadt, P.C.

(57) ABSTRACT

An aspect of the present invention includes a first conductive type semiconductor region; a gate electrode formed on the first conductive type semiconductor region; a channel region formed immediately below the gate electrode in the first conductive type semiconductor region; and a second conductive type first diffusion layer constituting source/drain regions formed at opposite sides of the channel region in the first conductive type semiconductor region, the gate electrode being formed of polycrystalline silicon-germanium, in which a germanium concentration is continuously increased from a drain region side to a source region side, and an impurity concentration immediately below the gate electrode in the first conductive type semiconductor region being continuously increased from the source region side to the drain region side in accordance with the germanium concentration in the gate electrode.

10 Claims, 15 Drawing Sheets

SEMICONDUCTOR DEVICE AND METHOD OF MANUFACTURING THE SAME

CROSS-REFERENCE TO RELATED APPLICATION

This application is a continuation-in-part of U.S. patent application Ser. No. 10/084,221, entitled "SEMICONDUCTOR DEVICE AND METHOD OF MANUFACTURING THE SAME" filed Feb. 28, 2002, and is based upon and claims the benefit of priority from the prior Japanese Patent Application No. 2002-373954, filed on Dec. 25, 2002, the entire contents of which are incorporated herein by reference.

BACKGROUND OF THE INVENTION

1. Field of the Invention

The present invention relates to a semiconductor device including a metal-insulator-semiconductor filed effect transistor (MISFET) and a method of manufacturing the same.

2. Related Background Art

It is known that in a MISFET or MOSFET, a hot carrier is generated as a result of electric field concentration at a gate edge, thereby to degrade the reliability of gate breakdown voltage. In order to prevent this, side portions of the gate are oxidized to thicken an insulating layer at the gate edge obtained by oxidizing the gate side portion, i.e., a reoxidized layer, to moderate the electric field intensity near the gate edge. However, a sufficient thickness of the reoxidized layer is required to appropriately moderate electric field. If a reoxidized layer 12 with a sufficient thickness is formed as shown in FIG. 8, this oxidized layer 12 may hinder subsequently-performed very-low-acceleration ion implantation or impurity doping using plasma, using gate electrodes 8a and 8b as masks, for forming an n-type extension layer 16 and a p-type extension layer 17 having a lower impurity concentration than n-type source/drain regions 20 and p-type source/drain regions 21. In FIG. 8, the reference numeral 1 denotes an n-type semiconductor substrate, 2a denotes a p-type semiconductor region, 2b denotes an n-type semiconductor region, 4 denotes a device isolating insulating layer, and 6a and 6b denote gate insulating layers.

Generally, polycrystalline silicon-germanium is used as a material of a gate electrode to activate an impurity (e.g., boron). When the reoxidized layer 12 with a sufficient thickness is formed as shown in FIG. 8, the edges of the gate electrodes 8a and 8b have a higher resistance value than the central portion 34 since deactivation of the impurity doped to make polycrystalline silicon-germanium conductive occurs at the side portions of the gate electrodes 8a and 8b. In a gate electrode which is particularly miniaturized, the proportion of the above-described deactivated portion in the gate electrode increases, thereby to form a depletion layer in the gate electrode. Accordingly, the capability of driving current of transistor is reduced, and the performance of MISFET is degraded.

Besides having a higher impurity activation ratio than polycrystalline silicon, which has conventionally been used as a material of gate electrode, polycrystalline silicon-germanium has a property that the band gap thereof is lower than that of polycrystalline silicon. In order to achieve a low threshold value with such a property, the substrate impurity concentration should be reduced as compare with the case where polycrystalline silicon is used. Generally, in order to inhibit the short-channel effect, the substrate impurity concentration should be set to be as high as possible. Accordingly, if polycrystalline silicon-germanium is used as the material of gate electrode, it is possible that the performance of the MISFET is degraded due to the short-channel effect. The above-described problem is especially noticeable in P-type MISFETs.

SUMMARY OF THE INVENTION

A semiconductor device according to a first aspect of the present invention includes: a first conductive type semiconductor region formed in a semiconductor substrate; a gate electrode formed on the first conductive type semiconductor region; a channel region formed immediately below the gate electrode in the first conductive type semiconductor region; and a second conductive type first diffusion layer constituting source/drain regions formed at opposite sides of the channel region in the first conductive type semiconductor region, the gate electrode being formed of polycrystalline silicon-germanium, in which a germanium concentration is continuously increased from a drain region side to a source region side, and an impurity concentration immediately below the gate electrode in the first conductive type semiconductor region being continuously increased from the source region side to the drain region side in accordance with the germanium concentration in the gate electrode.

A semiconductor device according to a second aspect of the present invention includes: a first conductive type semiconductor portion formed on a semiconductor substrate; a gate electrode formed to surround a side portion of the first conductive type semiconductor portion; a channel region formed in the first conductive type semiconductor portion surrounded by the gate electrode; and source and drain layers formed to cover an upper surface and a lower surface of the first conductive type semiconductor portion, the gate electrode being formed of polycrystalline silicon-germanium, in which a germanium concentration is increased from a drain layer side to a source layer side, and an impurity concentration in the channel region being increased from the source layer side to the drain layer side.

A semiconductor device according to a third aspect of the present invention includes:

a first MISFET including: a first conductive type first semiconductor region formed in a semiconductor substrate; a first gate electrode formed on the first conductive type first semiconductor region; a first channel region formed immediately below the first gate electrode in the first conductive type first semiconductor region; and a second conductive type first diffusion layer constituting source/drain regions formed at opposite sides of the first channel region in the first conductive type first semiconductor region; and a second MISFET including: a second conductive type second semiconductor region formed in the semiconductor substrate and isolated from the first conductive type first semiconductor region; a second gate electrode formed on the second conductive type second semiconductor region; a second channel region formed immediately below the second gate electrode in the second conductive type second semiconductor region; and a first conductive type second diffusion layer constituting source/drain regions formed at opposite sides of the second channel region in the second conductive type second semiconductor region, the first and second gate electrodes being formed of polycrystalline silicon-germanium, in which a germanium concentration is continuously increased from a drain region side to a source region side, and an impurity concentration immediately below the first gate electrode in the first conductive type first semiconductor region being continuously increased from the source region side to the drain region side in accordance with the germanium concentration in the first gate electrode.

DESCRIPTION OF THE EMBODIMENTS

Figure 1:
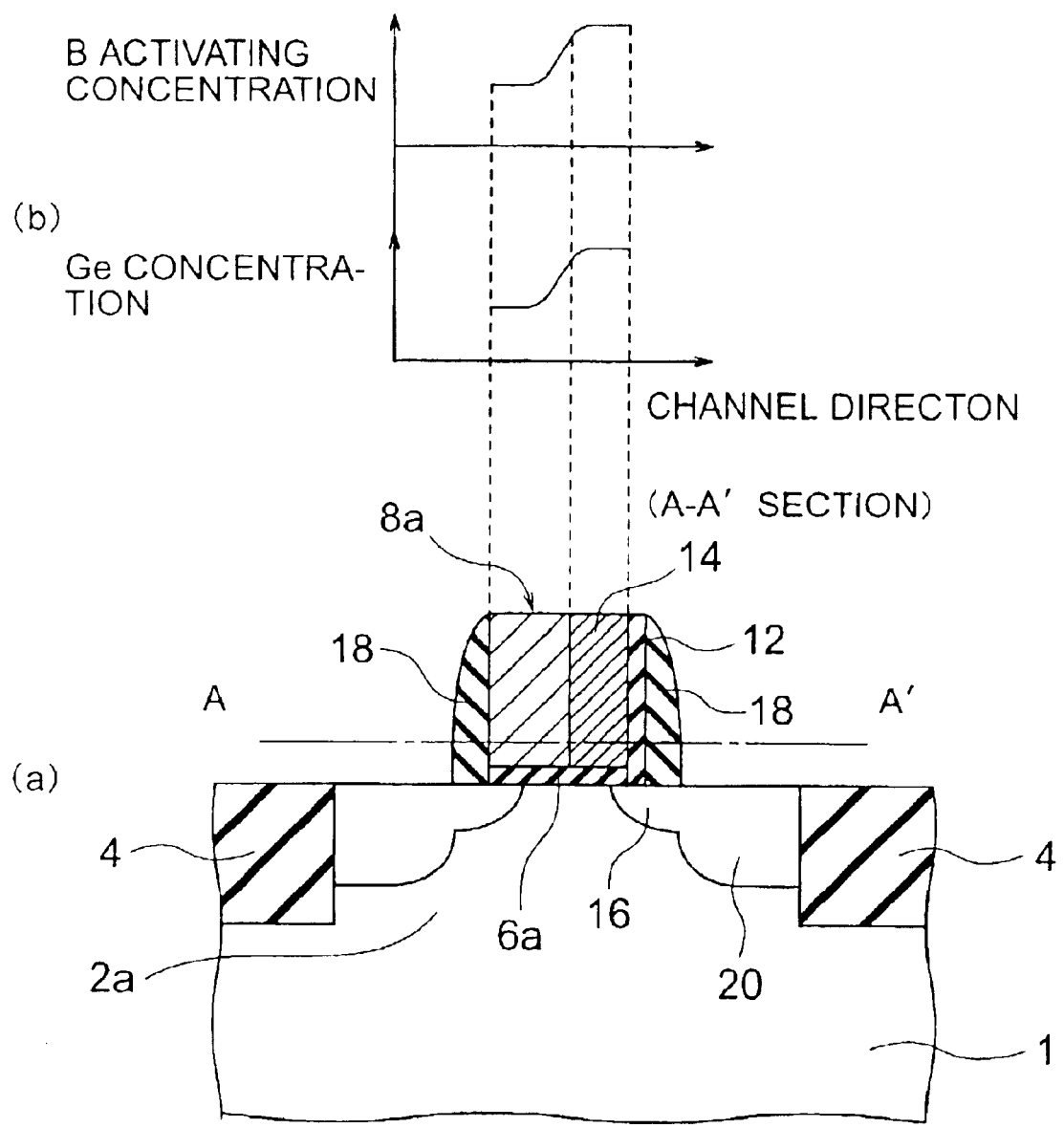
FIGS. 1(a) and 1(b) show the structure of a semiconductor device according to a first embodiment of the present invention.

Hereinafter, embodiments of the present invention will be described with reference to the accompanying drawings.
First Embodiment A semiconductor device according to a first embodiment of the present invention will be described with reference to FIGS. 1(a) to 1(b). The semiconductor device of this embodiment includes a MISFET having a gate electrode of polycrystalline silicon-germanium. FIG. 1(a) shows the structure thereof, and FIG. 1(b) shows the concentration distribution graph of boron (B) and germanium (Ge) at the section taken along line A–A' of FIG. 1(a).

The semiconductor device in this embodiment includes an n-channel MISFET having a gate electrode 8a formed in a p-type semiconductor region 2a of a semiconductor substrate 1, which gate electrode 8a is isolated by a device isolation insulating layer 4, a channel region formed immediately below the gate electrode 8a in the p-type semiconductor region 2a, an n-type diffusion layer 20 constituting source/drain regions formed at the opposite sides of the channel region in the p-type semiconductor region 2a, an n-type diffusion layer (hereinafter also referred to as "extension layer") 16 formed between the diffusion layer 20 and the channel region in the p-type semiconductor region 2a and having an impurity concentration lower than the diffusion layer 20, and a gate sidewall 18 of an insulating material formed at the side portion of the gate electrode 8a. Furthermore, in this MISFET, the gate electrode 8a is formed of polycrystalline silicon-germanium, and boron (B) is implanted thereto to make it conductive. As shown in FIG. 1(b), the germanium concentration of the gate electrode 8a is continuously increased from the drain side to the source side. That is, in the gate electrode 8a, a portion 14 having a higher activating concentration of boron and a higher concentration of germanium is formed at the source side, and a portion having lower concentrations is formed at the drain side. As germanium activates p-type impurities (such as boron), the activating concentration of boron is continuously increased from the drain side to the source side. An oxide layer 12 is formed between the portion 14 having a higher germanium concentration and the gate sidewall 18. The thickness of the portion 14 having a higher germanium concentration is substantially the same as that of the oxide layer 12. The germanium concentration of that portion is 1.5 to 2 times that of the central portion of the gate electrode 8a.

A source electrode and a drain electrode are formed on the source/drain regions 20, which are not shown in the drawings.

As described above, in this embodiment, since the germanium concentration at the source side is lower than that of the drain side, the impurity (boron) activating concentration of the drain side is lower than that of the source side. Accordingly, in the region near the drain region, to which a high electric field is applied, since a depletion layer expands in the gate electrode 8a, depletion layer capacitance is connected in series to the capacitance between the gate electrode 8a and the drain electrode (not shown). Accordingly, the gate capacitance is effectively decreased to moderate the electric filed at the drain edge, thereby inhibiting the degradation of the gate breakdown voltage at the drain edge. Accordingly, even if miniaturization of devices is carried out, it is possible to inhibit the degradation of performance.

Second Embodiment

Next, a method of manufacturing a semiconductor device according to a second embodiment of the present invention will be described with reference to FIGS. 2(a) to 2(d) and 3(a) to 3(b).

Figure 2:
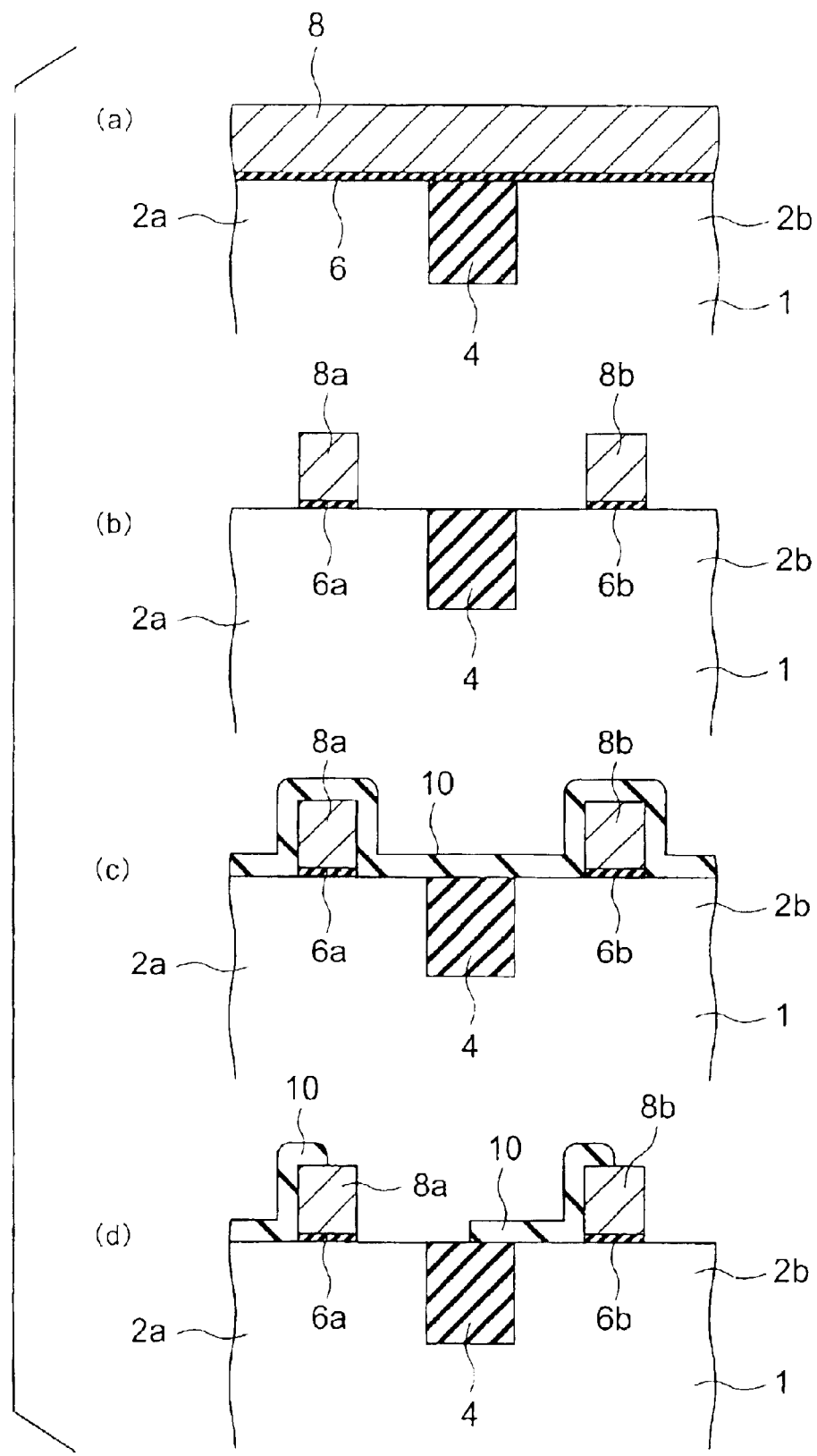
FIGS. 2(a) to 2(d) are sectional views showing manufacturing process of a method of manufacturing a semiconductor device according to a second embodiment of the present invention.

First, as shown in FIG. 2(a), a device isolation insulating layer 4 of an insulating material is formed in an n-type semiconductor substrate 1, and a p-type semiconductor region 2a is formed in one of the isolated regions by implanting a p-type impurity therein. Accordingly, the other of the isolated regions becomes an n-type semiconductor region 2b. Subsequently, a gate insulating layer 6 is formed over the p-type semiconductor region 2a and the n-type semiconductor region 2b, and a polycrystalline silicon-germanium layer 8 is deposited thereon by CVD (Chemical Vapor Deposition) method.

Then, as shown in FIG. 2(b), the polycrystalline silicon-germanium layer 8 is patterned by the lithography technique and RIE (Reactive Ion Etching) method to form gate electrodes 6a and 6b on the semiconductor regions 2a and 2b.

Figure 3:
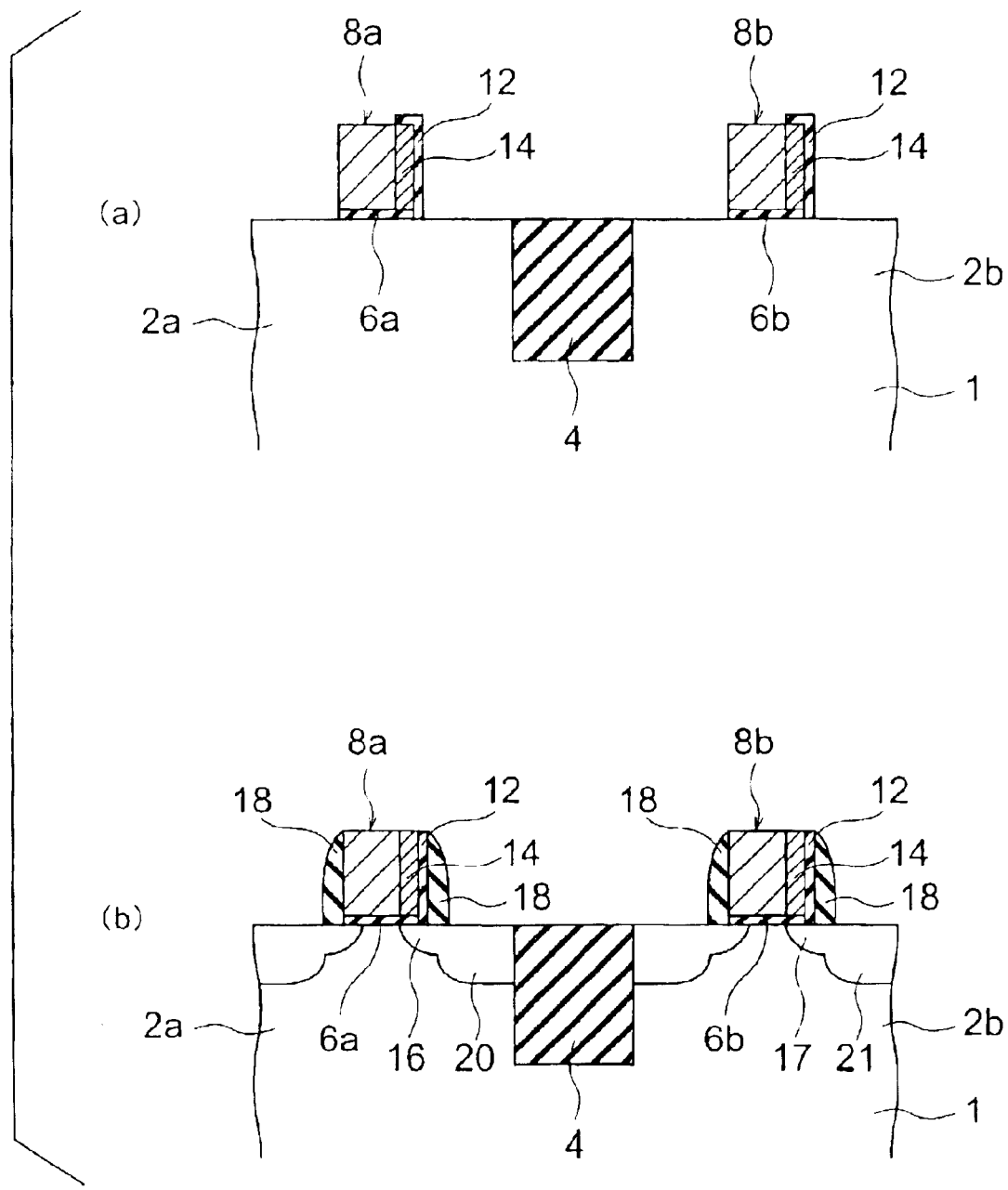
FIGS. 3(a) to 3(b) are sectional views showing manufacturing process of the method of manufacturing a semiconductor device according to the second embodiment of the present invention.

Next, as shown in FIG. 2(c), an oxidation preventing layer 10 of a material preventing the entry of oxidizer, e.g., silicon nitride, is deposited over the entire surface. Then, as shown in FIG. 2(d), the oxidation preventing layer 10 is pattered by the lithography technique to expose only one side (source side) of each electrode 8a, 8b. Then, as shown in FIG. 3(a), each of the exposed sides of the gate electrodes 8a and 8b is oxidized to form an oxide layer 12. Thereafter, the oxidation preventing layer 10 is removed. By setting the oxidation condition such that silicon in polycrystalline silicon-germanium is selectively oxidized, the germanium concentration is increased only in portions 14 of the gate electrodes 8a and 8b covered by the oxide layer 12. The thickness of the oxide layer 12 is set to be 0.5 nm or more, and 10 nm or less. The upper limit of the thickness of the oxide layer 12 is set such that ion implantation for forming source/drain extension layers 16 and 17 is not hindered. The lower limit is determined by considering the region at the gate edge portion where germanium concentration is increased, and the concentration thereof. In the MISFET thus obtained, if the germanium concentration at the time of deposition is 20%, the germanium concentration in the gate electrode with the oxide layer having a thickness of 2 nm at its source edge is 20% at its drain edge portion, and 40% at its source edge portion extending about 2 nm from the edge.

Next, ion-implantation of an impurity is performed to form the extension layers 16 and 17, as shown in FIG. 3(b). First, the extension layer 16 is formed by covering the p-channel MISFET forming region, i.e., the n-type semiconductor region 2b with a photo resist pattern, and by implanting an n-type impurity into the n-channel MISFET forming region, i.e., the p-type semiconductor region 2a using the gate electrode 8a as a mask. Subsequently, after the resist pattern is removed, the extension layer 17 is formed by covering the n-channel MISFET forming region 2a with a photo resist pattern, and by implanting a p-type impurity into the p-channel MISFET forming region 2b using the gate electrode 8b as a mask. Thereafter, the resist pattern is removed. Although the extension layer 17 was formed after the formation of the extension layer 16 in the above description, the extension layer 17 may be formed before the formation of the extension layer 16.

Next, a gate sidewall 18 is formed by depositing an insulating material all over the surface, and etching the insulating material by RIE method such that the insulating material remains on the side portions of the gate electrodes 8a and 8b. Thereafter, an n-type diffusion layer 20 and a p-type diffusion layer 21 serving as source/drain regions are formed. The n-type diffusion layer 20 is formed by performing ion implantation of an n-type impurity, e.g., arsenic (As$^+$) or phosphorus (P$^+$) into the n-channel MISFET forming region 2a using the gate electrode 8a as a mask after the formation of a photo resist pattern (not shown) covering the p-channel MISFET forming region 2b. After the above resist patter is removed, the p-type diffusion layer 21 is formed by performing ion implantation of a p-type impurity, e.g., boron (B$^+$), into the p-channel MISFET forming region 2b using the gate electrode 8b as a mask after the formation of a photo resist pattern (not shown) covering the n-channel MISFET forming region 2a. That is, the diffusion layer 20 is formed in a self-aligned manner with respect to the gate electrode 8a and the gate sidewall 18, and the diffusion layer 21 is formed in a self-aligned manner with respect to the gate electrode 8b and the gate sidewall 18. Although the diffusion layer 21 was formed after the formation of the diffusion layer 20 in the above description, the diffusion layer 21 may be formed before the formation of the diffusion layer 20.

Next, known anneal treatment with a fast thermal processing rate is performed to activate the diffusion layers 20 and 21 serving as source/drain regions. Thereafter, a salicide step to perform silicidation of only the portions where silicon is exposed is performed by depositing nickel, titan, or titanium nitride, performing anneal treatment, and removing unreacted metal layer by chemical treatment. Then, an insulating layer (not shown) is deposited, which is smoothed by CMP (Chemical Mechanical Polishing). Subsequently, a contact hole is formed through the insulating layer to the source/drain regions 20 and 21. Then, a metal is filled in the contact hole to form source/drain electrodes (not shown), thereby completing the MISFET.

In the MISFET manufactured by the method of this embodiment, the germanium concentration at the drain side is lower than that at the source side. Accordingly, the impurity activating concentration at the drain side is lowered. Therefore, in a portion near the drain, where a high electrical field is applied, a depletion layer extends in the gate electrode. Consequently, a depletion capacitance is connected in series with the capacitance between the gate electrode and the drain electrode. Thus, since the gate capacitance is effectively lowered to moderate the electrical field at the drain edge, it is possible to prevent the reduction in the gate breakdown voltage at the drain edge. If this embodiment is applied to the manufacture of a MISFET of 40 nm or less in channel length with an oxide layer at the source edge at 0.5 nm or more and 10 nm or less in thickness, it is possible to achieve a profile of which the germanium concentration is lowered from the source edge to the drain edge. Thus, it is possible to inhibit the degradation of performance even if miniaturization of devices is carried out.

Figure 4:
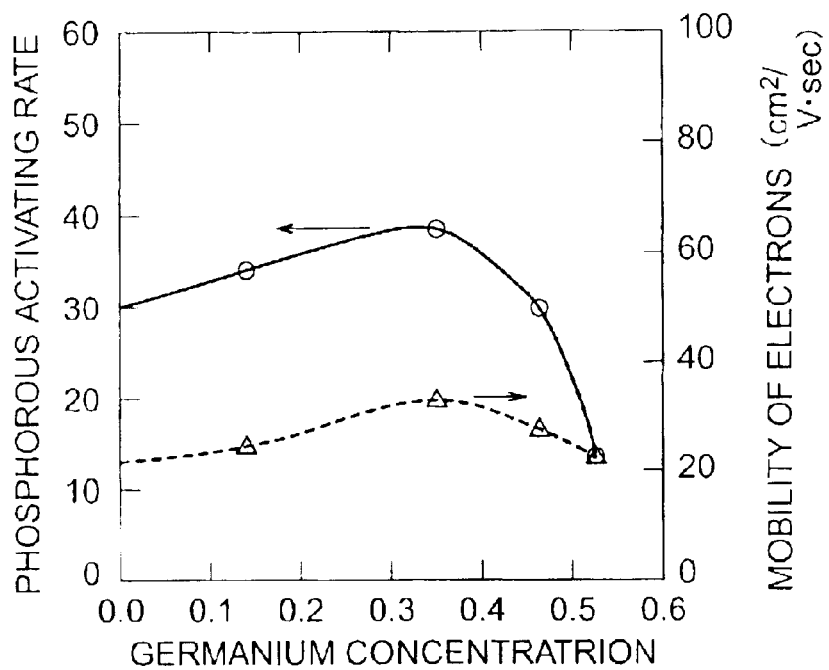
FIG. 4 is a graph showing the dependence of phosphorous activating rate on germanium concentration.
Figure 5:
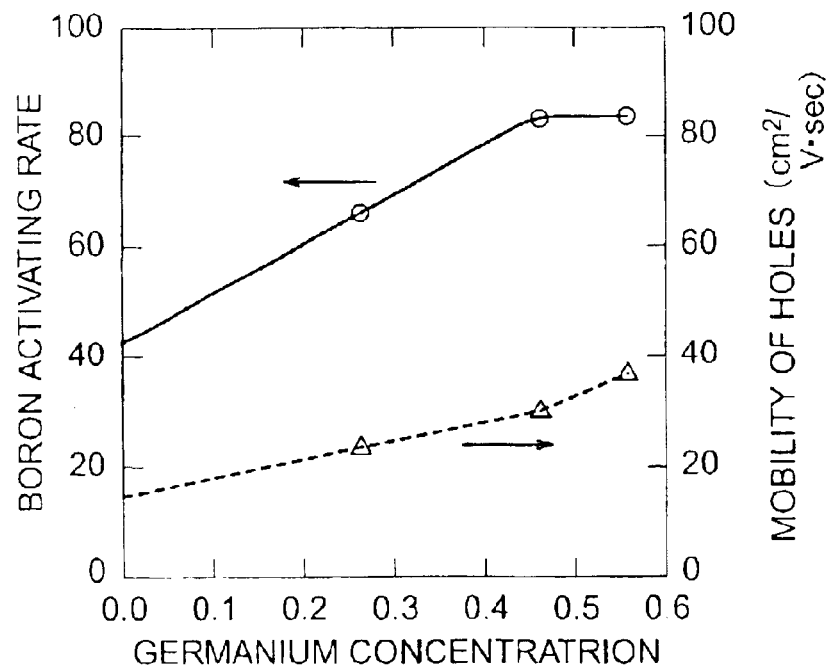
FIG. 5 is a graph showing the dependence of boron activating rate on germanium concentration.

FIGS. 4 and 5 show graphs of the dependence of phosphorous/boron activating rates on germanium concentration, by T. J. King, in IEEE Transaction Electron Devices, vol. 41, No. 2, p228, 1994. As can be understood from the graphs, the phosphorous/boron activating rates rise with an increase in germanium concentration of up to about 40%. Accordingly, in the manufacturing method of this embodiment, the same advantageous effects can be obtained for the n-channel MISFET and the p-channel MISFET. In FIG. 4, the solid line indicates the dependence of phosphorous activating rate on germanium concentration, and the broken line shows the germanium concentration dependence of electron mobility. In FIG. 5, the solid line indicates the dependence of boron activating rate on germanium concentration, and the broken line shows the germanium concentration dependence of hole mobility.

Third Embodiment

Figure 6:
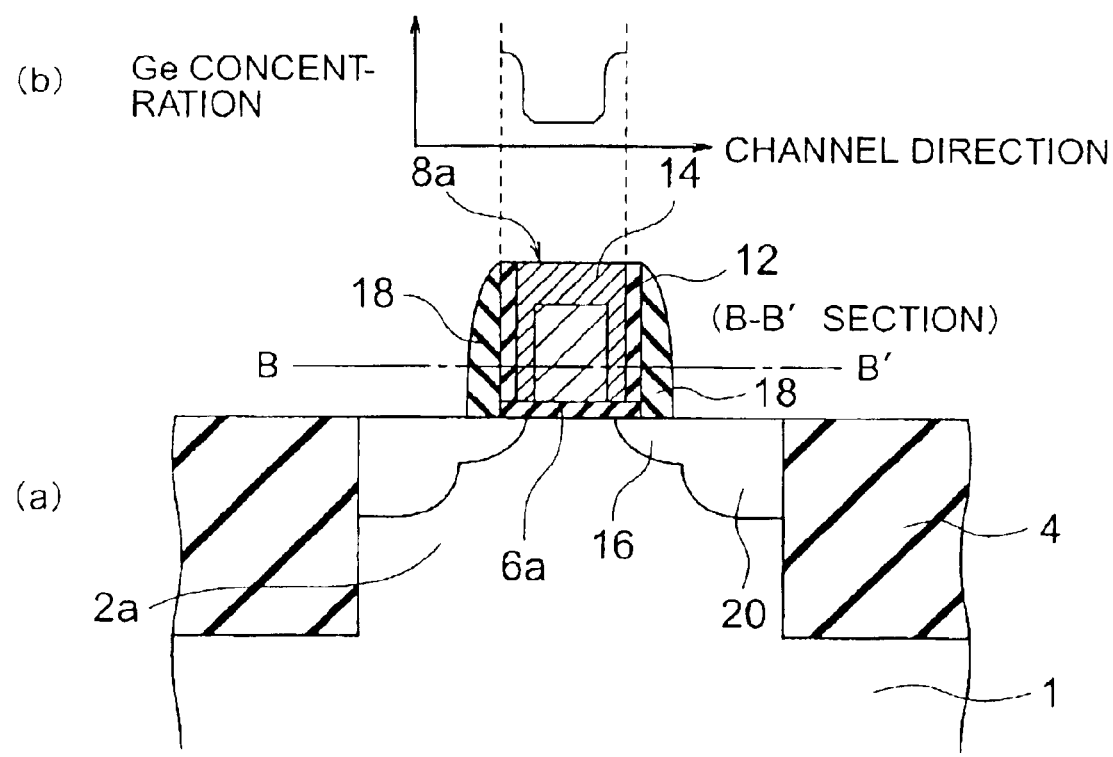
FIGS. 6(a) and 6(b) show the structure of a semiconductor device according to a third embodiment of the present invention.

FIGS. 6(a) and 6(b) show the structure of a semiconductor device according to a third embodiment of the present invention. The semiconductor device in this embodiment includes a MISFET having a gate electrode of polycrystalline silicon-germanium. FIG. 6(a) shows the structure of the MISFET, and FIG. 6(b) shows a graph of germanium (Ge) concentration distribution at the section taken along line B–B' in FIG. 6(a).

The semiconductor device in this embodiment includes an n-channel MISFET having a gate electrode 8a formed in a p-type semiconductor region 2a of a semiconductor substrate 1, which gate electrode 8a is isolated by a device isolation insulating layer 4, a channel region formed immediately below the gate electrode 8a in the p-type semiconductor region 2a, an n-type diffusion layer 20 constituting source/drain regions formed in the p-type semiconductor region 2a, an n-type diffusion layer (hereinafter also referred to as "extension layer") 16 formed between the diffusion layer 20 and the channel region in the p-type semiconductor region 2a and having an impurity concentration lower than the diffusion layer 20, and a gate sidewall 18 of an insulating material formed at the side portion of the gate electrode 8a. Furthermore, in this MISFET, the gate electrode 8a is formed of polycrystalline silicon-germanium, and boron (B) is implanted thereto to make it conductive. As shown in FIG. 6(b), the germanium concentration of the gate electrode 8a is continuously decreased from the source/drain sides to the central portion of the channel region. That is, in the gate electrode 8a, a portion 14 having a higher germanium concentration is formed at the source/drain sides and the upper portion, and a portion having a lower germanium concentration is formed at the central portion. Accordingly, the activating concentration of boron is continuously decreased from the source/drain sides to the central portion in the channel region. An oxide layer 12 is formed between the portion 14 having a higher germanium concentration and the gate sidewall 18. The thickness of the portion 14 having a higher germanium concentration is substantially the same as that of the oxide layer 12. The germanium concentration in the portion 14 is 1.5 to 2 times that of the central portion of the gate electrode 8a.

A source electrode and a drain electrode are formed on the source/drain regions 20, which are not shown in the drawings.

As described above, in this embodiment, each of the gate electrodes 8a and 8b has the structure that the germanium concentration at the source/drain sides is higher than that of the central portion. Accordingly, the impurity (boron) activating concentration of the source/drain sides is higher than that of the central portion, and the resistance of the source/drain sides is lower than that of the central portion. Therefore, even if the miniaturization of the device is carried out, the proportion of the inactive region (high resistance region) in the gate electrode is not increased. Accordingly, it is possible to inhibit the formation of depletion layer in the gate electrode, thereby preventing the decrease in the capability of driving current of transistors. Thus, it is possible to inhibit the degradation of performance even if miniaturization of devices is carried out.

Fourth Embodiment

Next, a method of manufacturing a semiconductor device according to a fourth embodiment of the present invention will be described with reference to FIGS. 7(a) to 7(d) showing sectional views of the process of manufacturing a MISFET formed in accordance with the method of this embodiment.

Figure 7:
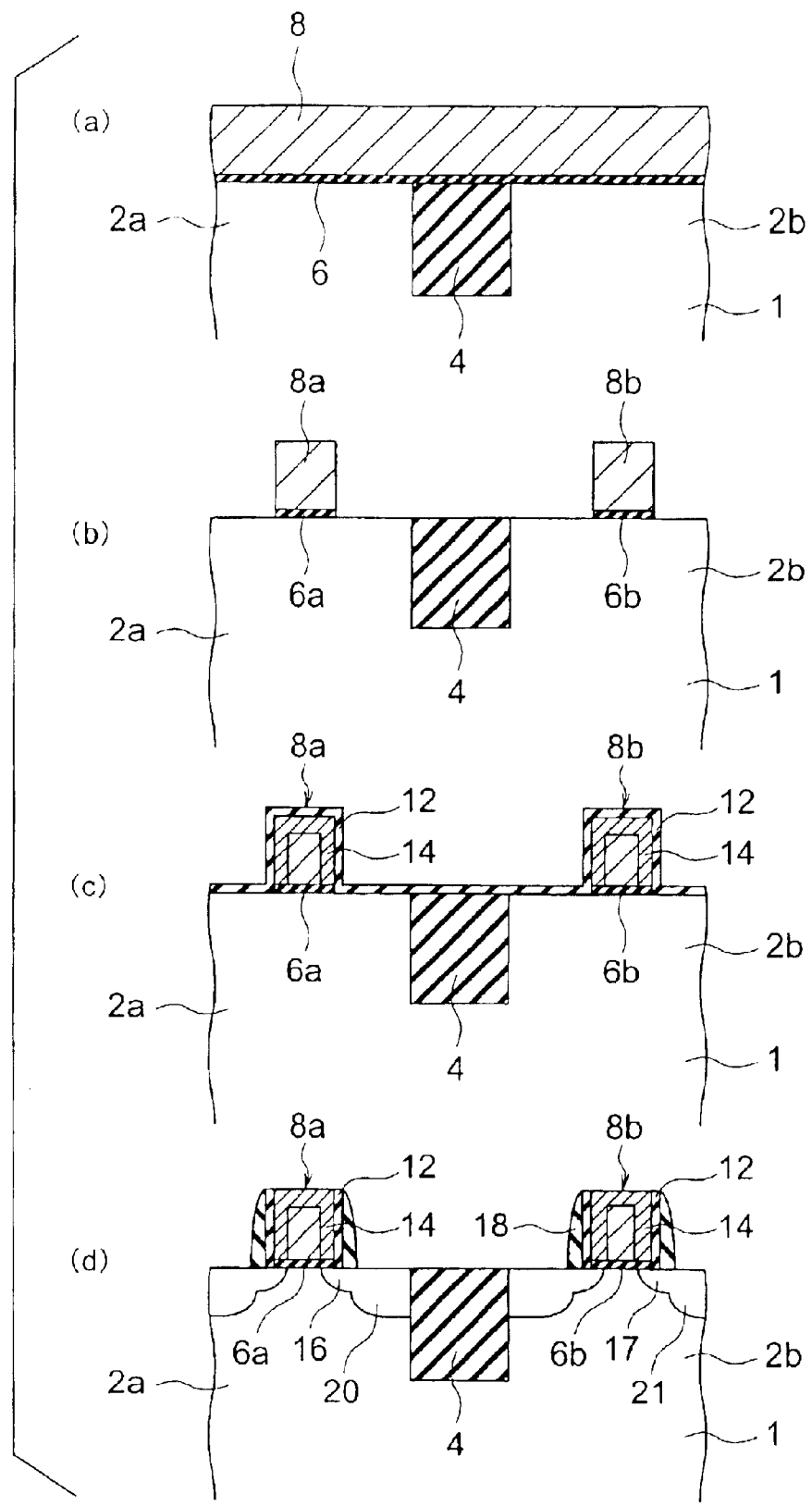
FIGS. 7(a) to 7(d) are sectional views showing manufacturing process of a method of manufacturing a semiconductor device according to a fourth embodiment of the present invention.
Figure 8:
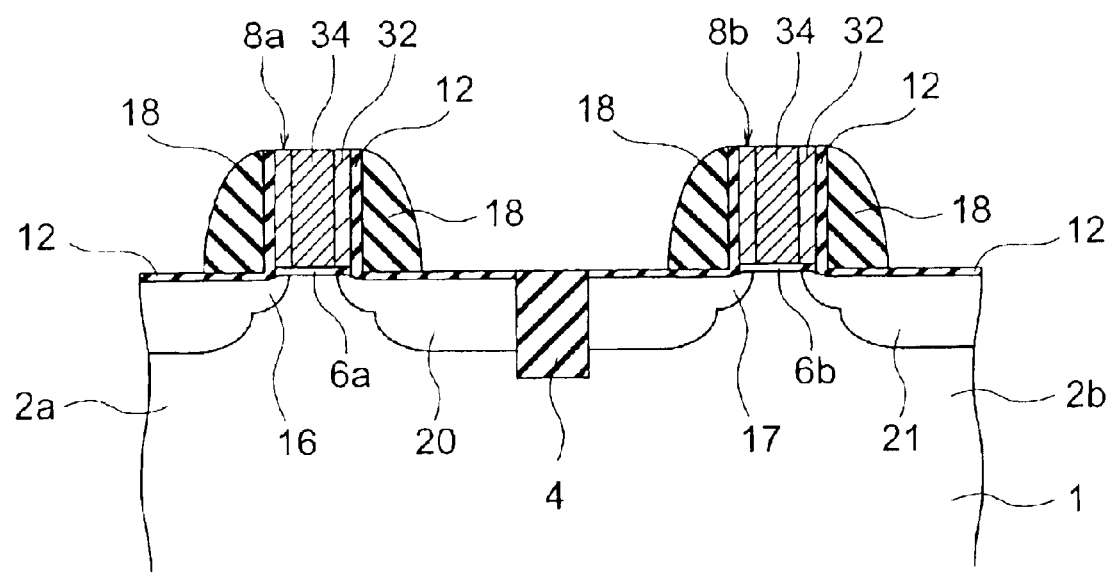
FIG. 8 is a sectional view showing the structure of a conventional semiconductor device.

First, as shown in FIG. 7(a), a device isolation insulating layer 4 of an insulating material is formed in an n-type semiconductor substrate 1, and a p-type semiconductor region 2a is formed in one of the isolated regions by implanting a p-type impurity therein. Accordingly, the other of the isolated regions becomes an n-type semiconductor region 2b. Subsequently, a gate insulating layer 6 is formed over the p-type semiconductor region 2a and the n-type semiconductor region 2b, and a polycrystalline silicon-germanium layer 8 is deposited thereon by thermal CVD method.

Then, as shown in FIG. 7(b), the polycrystalline silicon-germanium layer 8 is patterned by the lithography technique and RIE (Reactive Ion Etching) method to form gate electrodes 6a and 6b on the semiconductor regions 2a and 2b.

Subsequently, an oxide layer 12 is formed by selectively oxidizing the exposed surfaces of the gate electrodes 8a and 8b, as shown in FIG. 7(c). By setting the oxidation condition such that silicon in polycrystalline silicon-germanium is selectively oxidized, the germanium concentration is increased only in portions 14 of the gate electrodes 8a and 8b covered by the oxide layer 12 formed near both the sides and upper portions of the gate electrodes 8a and 8b.

Next, ion-implantation of an impurity to form extension layers 16 and 17 is performed, as shown in FIG. 7(d). First, the extension layer 16 is formed by covering the p-channel MISFET forming region, i.e., the n-type semiconductor region 2b with a photo resist pattern, and by implanting an n-type impurity into the n-channel MISFET forming region, i.e., the p-type semiconductor region 2a using the gate electrode 8a as a mask. Subsequently, after the resist pattern is removed, the extension layer 17 is formed by covering the n-channel MISFET forming region 2a with a photo resist pattern, and by implanting a p-type impurity into the p-channel MISFET forming region 2b using the gate electrode 8b as a mask. Thereafter, the resist pattern is removed. Although the extension layer 17 was formed after the formation of the extension layer 16 in the above description, the extension layer 17 may be formed before the formation of the extension layer 16.

Next, a gate sidewall 18 is formed by depositing an insulating material all over the surface, and etching the insulating material by RIE method such that the insulating material remains on the side portions of the gate electrodes 8a and 8b. The oxide layer 12 on the gate electrodes 8a and 8b is removed in the above etching step. Thereafter, an n-type diffusion layer 20 and a p-type diffusion layer 21 serving as source/drain regions are formed. The n-type diffusion layer 20 is formed by performing ion implantation of an n-type impurity, e.g., arsenic ($As^+$) or phosphorus ($P^+$) into the n-channel MISFET forming region 2a using the gate electrode 8a as a mask after the formation of a photo resist pattern (not shown) covering the p-channel MISFET forming region 2b. After the above resist pattern is removed, the p-type diffusion layer 21 is formed by performing ion implantation of a p-type impurity, e.g., boron ($B^+$), into the p-channel MISFET forming region 2b using the gate electrode 8b as a mask after the formation of a photo resist pattern (not shown) covering the n-channel MISFET forming region 2a. That is, the diffusion layer 20 is formed in a self-aligned manner with respect to the gate electrode 8a and the gate sidewall 18, and the diffusion layer 21 is formed in a self-aligned manner with respect to the gate electrode 8b and the gate sidewall 18. Although the diffusion layer 21 was formed after the formation of the diffusion layer 20 in the above description, the diffusion layer 21 may be formed before the formation of the diffusion layer 20.

Next, known anneal treatment with a fast thermal processing rate is performed to activate the diffusion layers 20 and 21 serving as source/drain regions. Thereafter, a salicide step to perform silicidation of only the portions where silicon is exposed is executed by depositing nickel, titan, or titanium nitride, performing anneal treatment, and removing unreacted metal layer by chemical treatment. Then, an insulating layer (not shown) is deposited, which is smoothed by CMP (Chemical Mechanical Polishing). Subsequently, a contact hole is formed through the insulating layer to the source/drain regions 20 and 21. Then, a metal is filled in the contact hole to form source/drain electrode (not shown), thereby completing the MISFET.

As described above, in this embodiment, each of the gate electrodes 8a and 8b has the structure that the germanium concentration at the source/drain sides is higher than that of the central portion. Accordingly, the impurity (boron) activating concentration of the source/drain sides is higher than that of the central portion, and the resistance of the source/drain sides is lower than that of the central portion. Therefore, even if the miniaturization of the device is carried out, the proportion of the inactive region (high resistance region) in the gate electrode is not increased. Accordingly, it is possible to inhibit the formation of depletion layer in the gate electrode, thereby preventing the decrease in the capability of driving current of transistors. Thus, it is possible to inhibit the degradation of performance even if miniaturization of devices is carried out.

Fifth Embodiment

Figure 9:
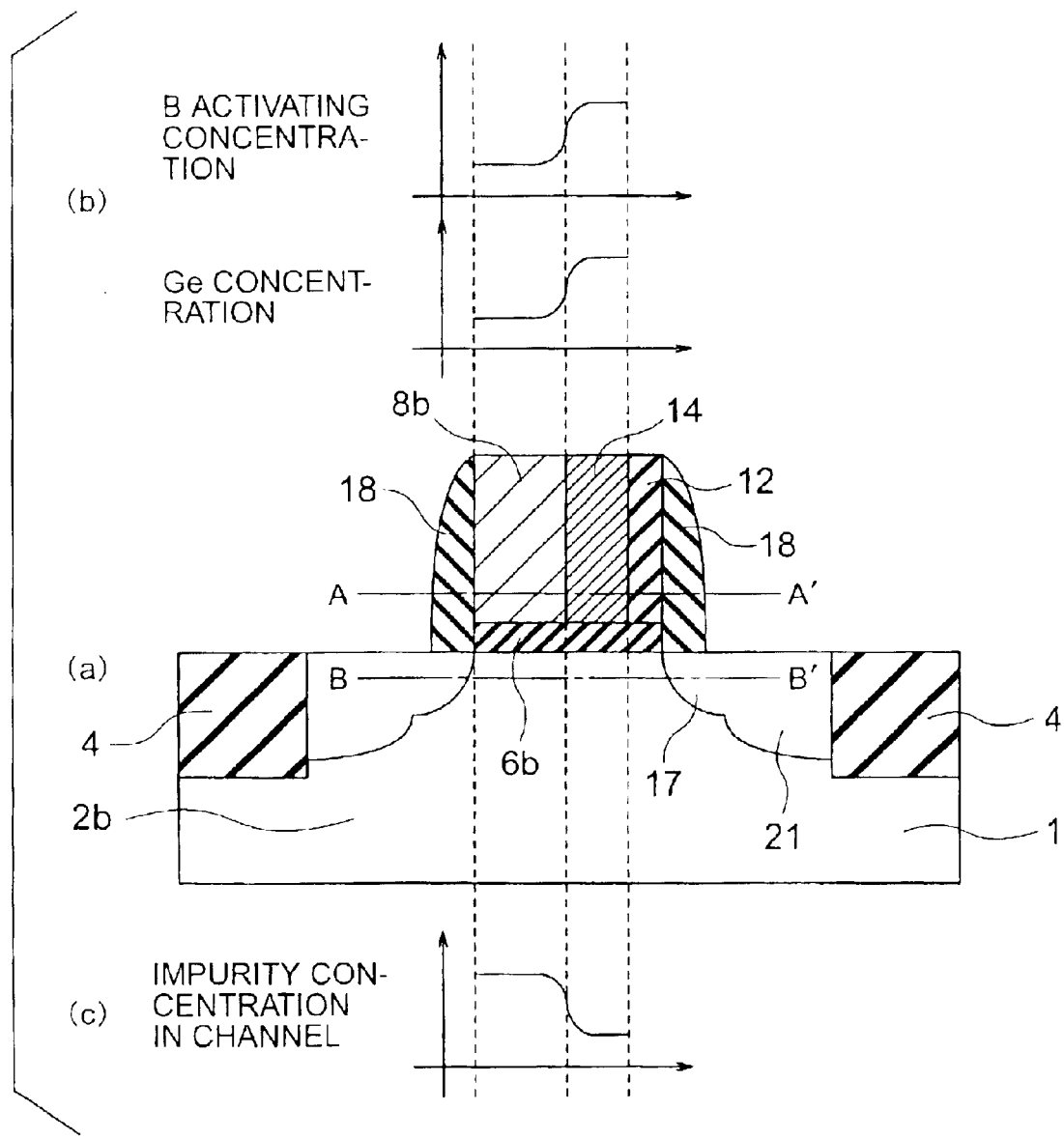
FIGS. 9(a) to 9(c) show the structure of a semiconductor device according to a fifth embodiment of the present invention.

A semiconductor device according to a fifth embodiment of the present invention will be described with reference to FIGS. 9(a) to 9(c). The semiconductor device in this embodiment includes a MISFET having a gate electrode of polycrystalline silicon-germanium. FIG. 9(a) shows the structure of the MISFET, FIG. 9(b) shows a graph of germanium (Ge) concentration distribution at the section taken along line A–A' in FIG. 9(a), and FIG. 9(c) is a graph of channel impurity concentration distribution taken along line B–B' in FIG. 9(a).

The semiconductor device in this embodiment includes a p-channel MISFET having a gate electrode 8b formed in an n-type semiconductor region 2b of a semiconductor substrate 1, which gate electrode 8b is isolated by a device isolation insulating layer 4, a channel region formed immediately below the gate electrode 8b in the n-type semiconductor region 2b, a p-type diffusion layer 21 constituting source/drain regions formed in the n-type semiconductor region 2b, a p-type diffusion layer (hereinafter also referred to as "extension layer") 17 formed between the diffusion layer 21 and the channel region in the n-type semiconductor region 2b and having an impurity concentration lower than that of the diffusion layer 21, and a gate sidewall 18 of an insulating material formed at the side portion of the gate electrode 8b.

Furthermore, in this MISFET, the gate electrode 8b is formed of polycrystalline silicon-germanium, and boron (B) is implanted thereto to make it conductive. As shown in FIG. 9(b), the germanium concentration of the gate electrode 8b is continuously increased from the drain side to the source side. That is, in the gate electrode 8b, a portion 14 having a higher activating concentration of boron and a higher concentration of germanium is formed at the source side, and a portion having a lower concentrations is formed at the drain side. As germanium activates p-type impurities (such as boron), the activating concentration of boron is continuously increased from the drain side to the source side. An oxide layer 12 is formed between the portion 14 having a higher germanium concentration and the gate sidewall 18. The thickness of the portion 14 having a higher germanium concentration is substantially the same as that of the oxide layer 12. The germanium concentration of that portion is 1.5 to 2 times that of the central portion of the gate electrode 8b.

The impurity concentration distribution in the channel region immediately below the gate is continuously increased from the source side to the drain side, as shown in FIG. 9(c).

A source electrode and a drain electrode are formed on the source/drain regions 21, which are not shown in the drawings.

As described above, in the gate electrode 8b of this embodiment, the germanium concentration is lower at the drain side than at the source side. Accordingly, the activating concentration of the impurity (boron) is higher at the source side than at the drain side. In conventional devices, the depletion in gate electrode is more remarkable at the source side. However, in this embodiment, the higher impurity activating concentration at the source side inhibits the formation of depletion layer in the portion 14 of the gate electrode 8b where the germanium concentration is higher, resulting in that it is possible to inhibit the decrease in effective gate capacitance due to the depletion layer capacitance. Accordingly, it is possible to inhibit the degradation in performance of the gate electrode 8b caused by the depletion layer to the minimum.

Moreover, in this embodiment, since the germanium concentration of the gate electrode is lower at the source side than at the drain side, the impurity concentration in the channel region is continuously decreased from the drain side to the source side.

The threshold value of a p-channel MISFET tends to increase as the germanium concentration in a gate electrode 8b increases. However, it is possible to inhibit the decrease in threshold value by forming the impurity concentration distribution in the channel region in accordance with the germanium concentration in the gate electrode. Further, since the impurity concentration in the channel is increased from the source side to the drain side, it is possible to inhibit the formation of depletion layer at the drain side of the diffusion layer. As a result, it is possible to inhibit the short-channel effect, thereby inhibiting the degradation of performance even if miniaturization of devices is carried out.

Sixth Embodiment

Next, a method of manufacturing a semiconductor device according to a sixth embodiment of the present invention will be described with reference to FIGS. 10(a) to 10(c) and 11(a) to 11(c).

Figure 10:
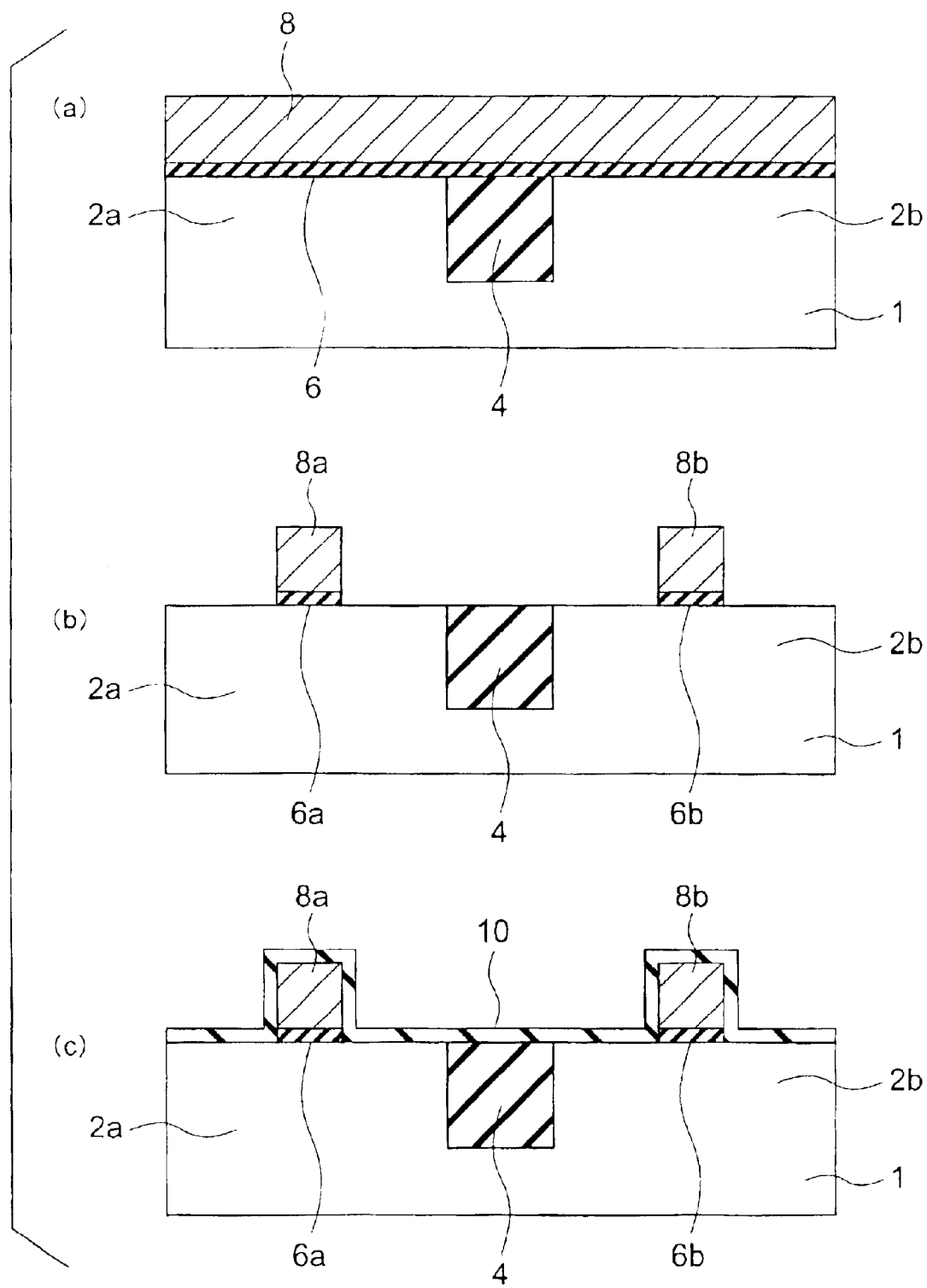
FIGS. 10(a) to 10(c) are sectional views showing manufacturing process of a method of manufacturing a semiconductor device according to a sixth embodiment of the present invention.

First, as shown in FIG. 10(a), a device isolation insulating layer 4 of an insulating material is formed in an n-type semiconductor substrate 1, and a p-type semiconductor region 2a is formed in one of the isolated regions by implanting a p-type impurity therein. Accordingly, the other of the isolated regions becomes an n-type semiconductor region 2b. Subsequently, a gate insulating layer 6 is formed over the p-type semiconductor region 2a and the n-type semiconductor region 2b, and a polycrystalline silicon-germanium layer 8 is deposited by thermal CVD (Chemical Vapor Deposition) method.

Then, as shown in FIG. 10(b), the polycrystalline silicon-germanium layer 8 is patterned by the lithography technique and RIE (Reactive Ion Etching) method to form gate electrodes 6a and 6b on the semiconductor regions 2a and 2b.

Figure 11:
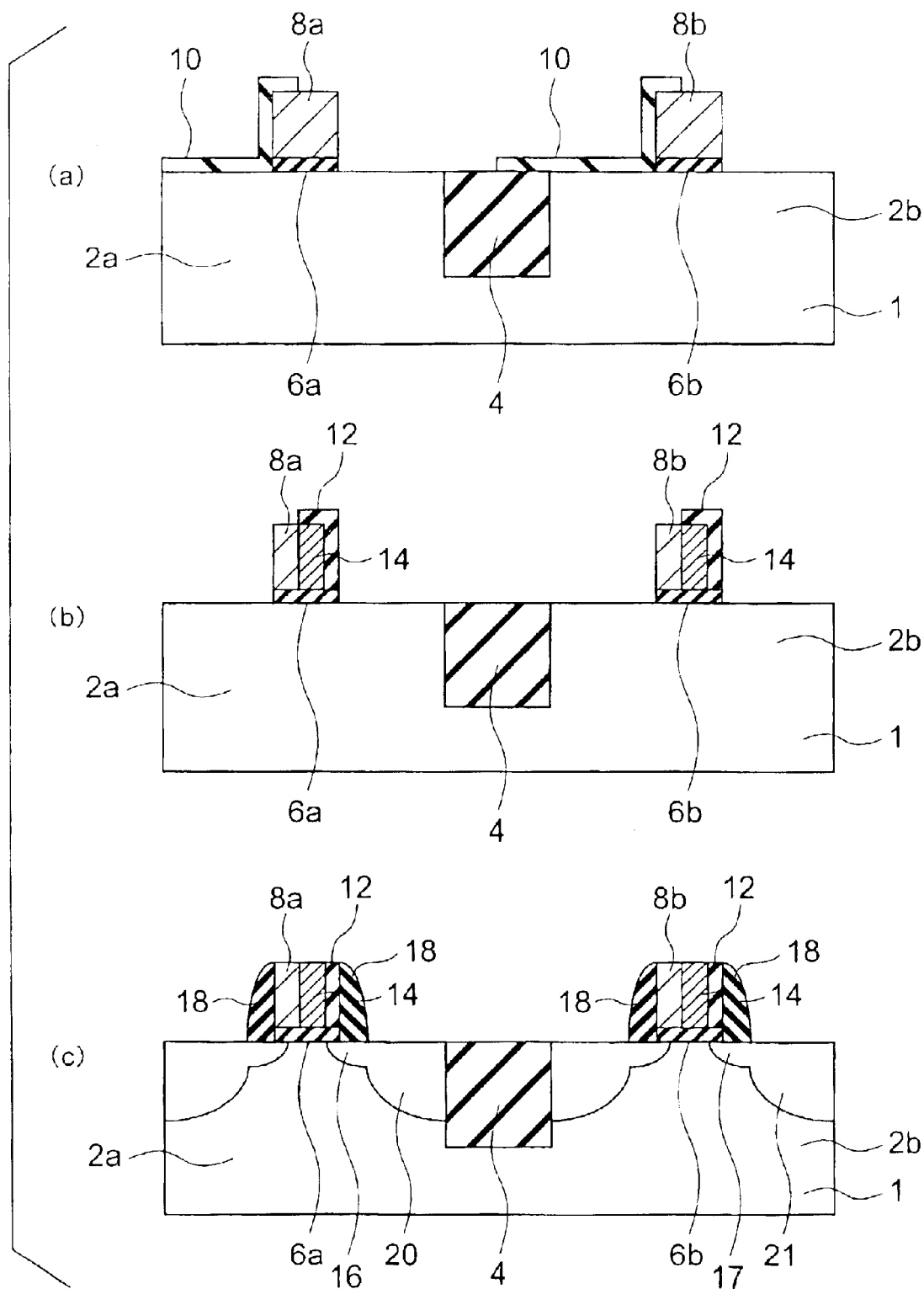
FIGS. 11(a) to 11(c) are sectional views showing manufacturing process of the method of manufacturing a semiconductor device according to the sixth embodiment of the present invention.

Subsequently, an oxidation preventing layer 10 of a material for preventing the entry of an oxidizing agent, e.g., silicon nitride, is deposited on the entire surface, as shown in FIG. 10(c). Thereafter, as shown in FIG. 11(a), the oxidation preventing layer 10 is patterned by using the lithography technique to expose only one side (source side) of the gate electrodes 8a and 8b. Then, as shown in FIG. 11(b), the exposed sides of the gate electrodes 8a and 8b are oxidized to form an oxide layer 12. Thereafter, the oxidation preventing layer 10 is removed. The oxidation conditions are set such that silicon in polycrystalline silicon-germanium is selectively oxidized. Accordingly, the germanium concentration is increased only in portions 14 of the gate electrodes 8a and 8b covered by the oxide layer 12. The thickness of the oxide layer is 0.5 nm or more and 10 nm or less. The upper limit of the thickness of the oxide layer 12 is set so that the ion implantation to form source/drain extension layers 16 and 17, which will subsequently be performed, is not prevented. The lower limit is determined in consideration of the region of the gate edge portion in which the germanium concentration is increased, and the germanium concentration thereof.

In a MISFET formed in the above-described manner, if the germanium concentration at the time of deposition is 20%, the germanium concentration in the gate electrode including, at the source end, the oxide layer having a thickness of 2 nm is 20% at the drain end while it is as high as 40% in the region from the source end to about 2 nm from the source end.

Next, impurity ion implantation is performed to form the extension layers 16 and 17 (FIG. 11(c)). First, the extension layer 16 is formed by covering the p-channel MISFET forming region, i.e., the n-type semiconductor region 2b, with a photo resist pattern, and then by implanting an n-type impurity into the n-channel MISFET forming region, i.e., the p-type semiconductor region 2a using the gate electrode 8a as a mask. Subsequently, after the above-described resist pattern is removed, the extension layer 17 is formed by first covering the n-channel MISFET forming region 2a with a photo resist pattern, and then by implanting a p-type impurity into the p-channel MISFET forming region 2b using the gate electrode 8b as a mask. Thereafter, an n-type impurity is implanted at an angle from the drain side using the gate electrode 8b as a mask. The ion implantation conditions are set in the following manner.

Figure 12:
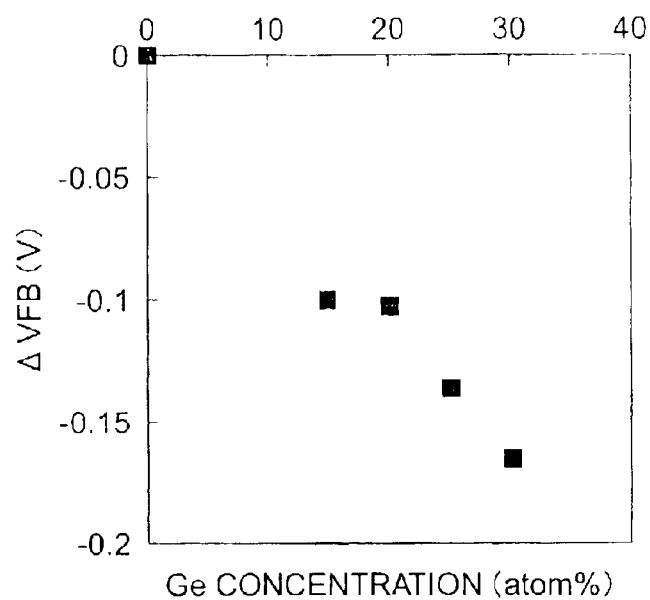
FIG. 12 shows the dependence of ΔVFB, which is obtained by subtracting the flat band voltage of polycrystalline silicon from the flat band voltage of the polycrystalline silicon-germanium, on the germanium concentration.

FIG. 12 shows the dependence of ΔVFB, which is obtained by subtracting the flat band voltage of polycrystalline silicon from the flat band voltage of the polycrystalline silicon-germanium, on the germanium concentration. It can be understood from FIG. 12 that as the germanium concentration increases, the flat band voltage decreases (the absolute value thereof increases). The n-type impurity ions are implanted from the drain side so as to compensate for ΔVFB to make the threshold value constant from the source side to the drain side.

Figure 13:
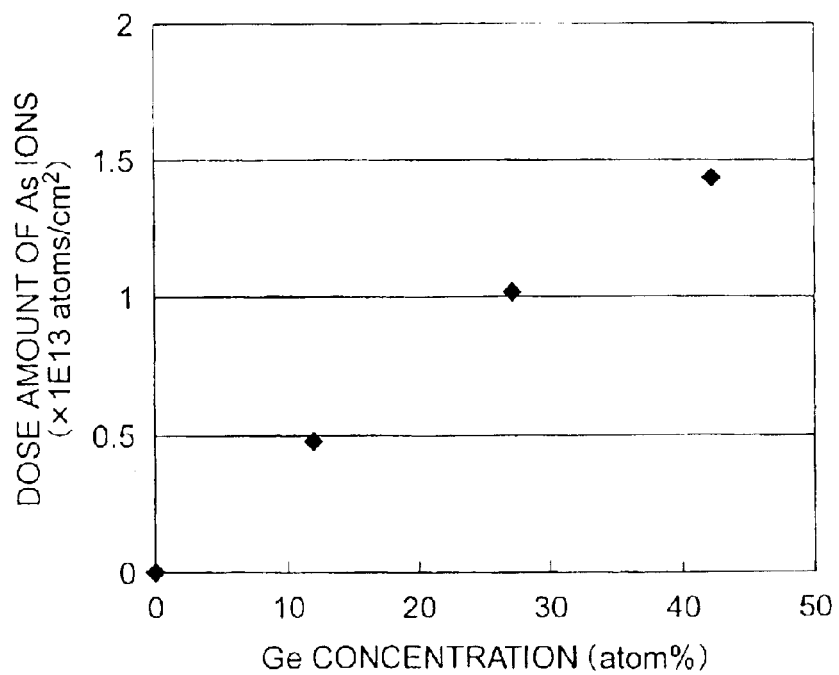
FIG. 13 shows the relationship between the As implantation amount required to achieve the same threshold value and the germanium concentration in gate electrode.

For examples, in the case where $4.0 \times 10^{12}$ ions of As have been implanted to the channel region of the p-channel MISFET with an acceleration voltage of 40 keV, the dose amount of As ions to be implanted is decided in accordance with the germanium concentration of polycrystalline silicon-germanium of the channel region, as shown in FIG. 13.

Thereafter, the above-described resist pattern is removed. Although the extension layer 17 was formed after the formation of the extension layer 16 in the above description, the extension layer 17 may be formed before the formation of the extension layer 16.

Next, a gate sidewall 18 is formed by depositing an insulating material over the entire surface, and etching the insulating material by RIE method such that the insulating material remains on the side portions of the gate electrodes 8a and 8b (FIG. 11(c)). Subsequently, an n-type diffusion layer 20 and a p-type diffusion layer 21 serving as source/drain regions are formed. The n-type diffusion layer 20 is formed by first forming a photo resist pattern (not shown) covering the p-channel MISFET forming region 2b, and then by performing ion implantation of an n-type impurity, e.g., arsenic ($As^+$) or phosphorus ($P^+$) into the n-channel MISFET forming region 2a using the gate electrode 8a as a mask. After the resist pattern is removed, the p-type diffusion layer 21 is formed by first forming a photo resist pattern (not shown) covering the n-channel MISFET forming region 2a, and then by performing ion implantation of a p-type impurity, e.g., boron ($B^+$), into the p-channel MISFET forming region 2b using the gate electrode 8b as a mask. That is, the diffusion layer 20 is formed in a self-aligned manner with respect to the gate electrode 8a and the gate sidewall 18, and the diffusion layer 21 is formed in a self-aligned manner with respect to the gate electrode 8b and the gate sidewall 18. Although the diffusion layer 21 was formed after the formation of the diffusion layer 20 in the above description, the diffusion layer 21 may be formed before the formation of the diffusion layer 20.

Next, known anneal treatment with a fast thermal processing rate is performed to activate the diffusion layers 20 and 21 serving as source/drain regions. Thereafter, a saliside step to perform silicidation of only the portions where silicon is exposed is executed by first depositing nickel, titan, or titanium nitride, then performing anneal treatment, and then removing unreacted metal layer by chemical treatment. Then, an insulating layer (not shown) is deposited, which is smoothed by CMP (Chemical Mechanical Polishing). Subsequently, a contact hole is formed through the insulating layer to the source/drain regions 20 and 21 using the lithography technique. Then, a metal is filled in the contact hole to form source/drain electrodes (not shown), thereby completing the MISFET.

In the MISFET manufactured by the manufacturing method according to this embodiment, the germanium concentration is higher at the source side than at the drain side, and the impurity activating concentration is higher at the source side than at the drain side. Accordingly, it is possible to prevent the formation of a depletion layer at the source side of the gate electrode, thereby preventing the reduction in effective gate capacitance due to the depletion layer capacitance. As a result, it is possible to inhibit the degradation of performance caused by the depletion in the gate electrode.

Further, since the impurity concentration in the channel region is continuously decreased from the drain side to the source side in accordance with the germanium concentration distribution in the gate electrode, it is possible to inhibit the increase in threshold value caused by the fluctuations of the band gap of the gate electrode.

In addition, since the impurity concentration in the channel region is increased from the source side to the drain side, it is possible to prevent the formation of depletion layer in the diffusion layer at the drain side. As a result, it is possible to inhibit the short-channel effect, thereby inhibiting the degradation of performance even if miniaturization of devices is carried out.

Seventh Embodiment

Figure 14:
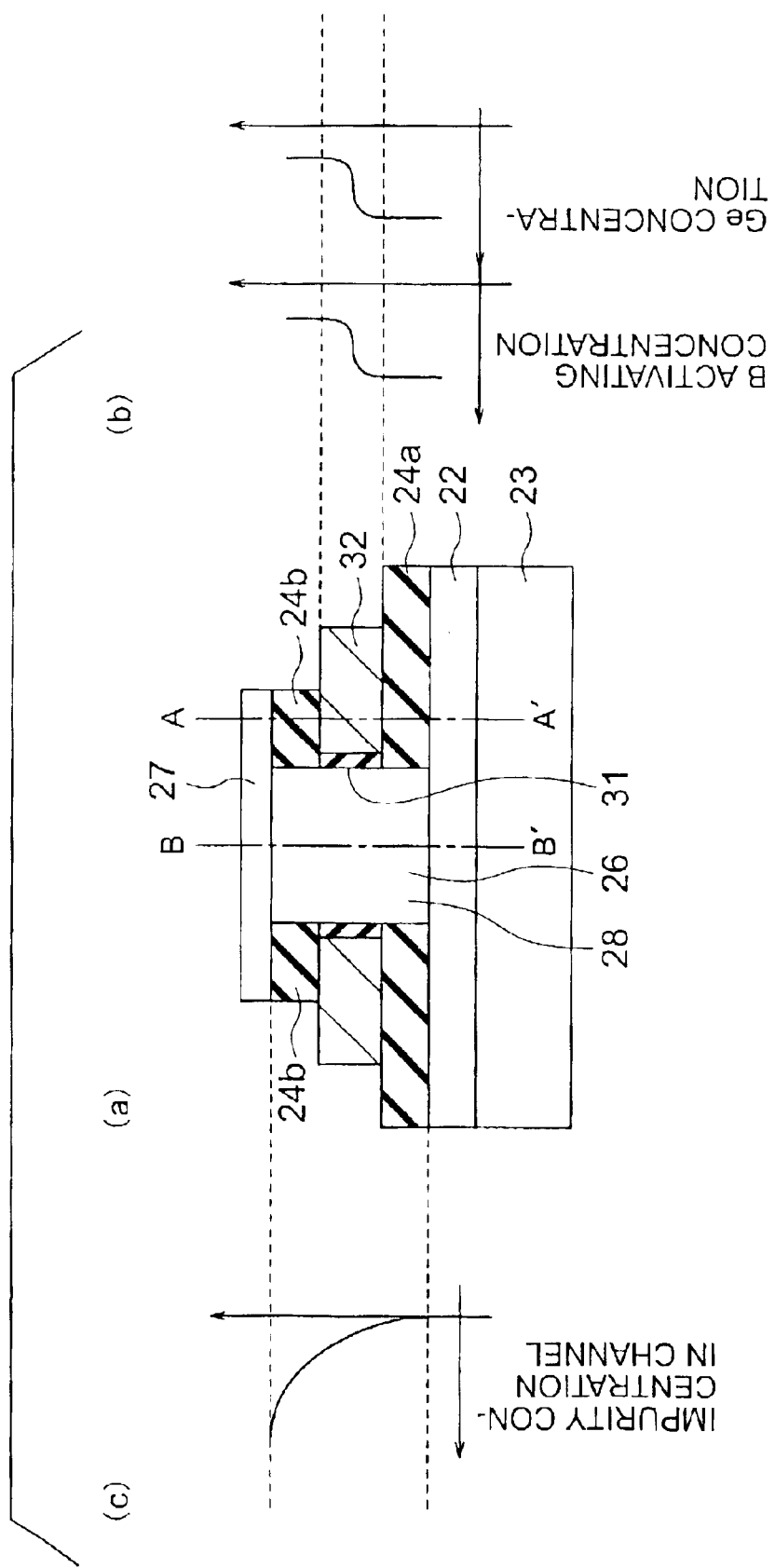
FIGS. 14(a) to 14(c) show the structure of a semiconductor device according to a seventh embodiment of the present invention.
Figure 15:
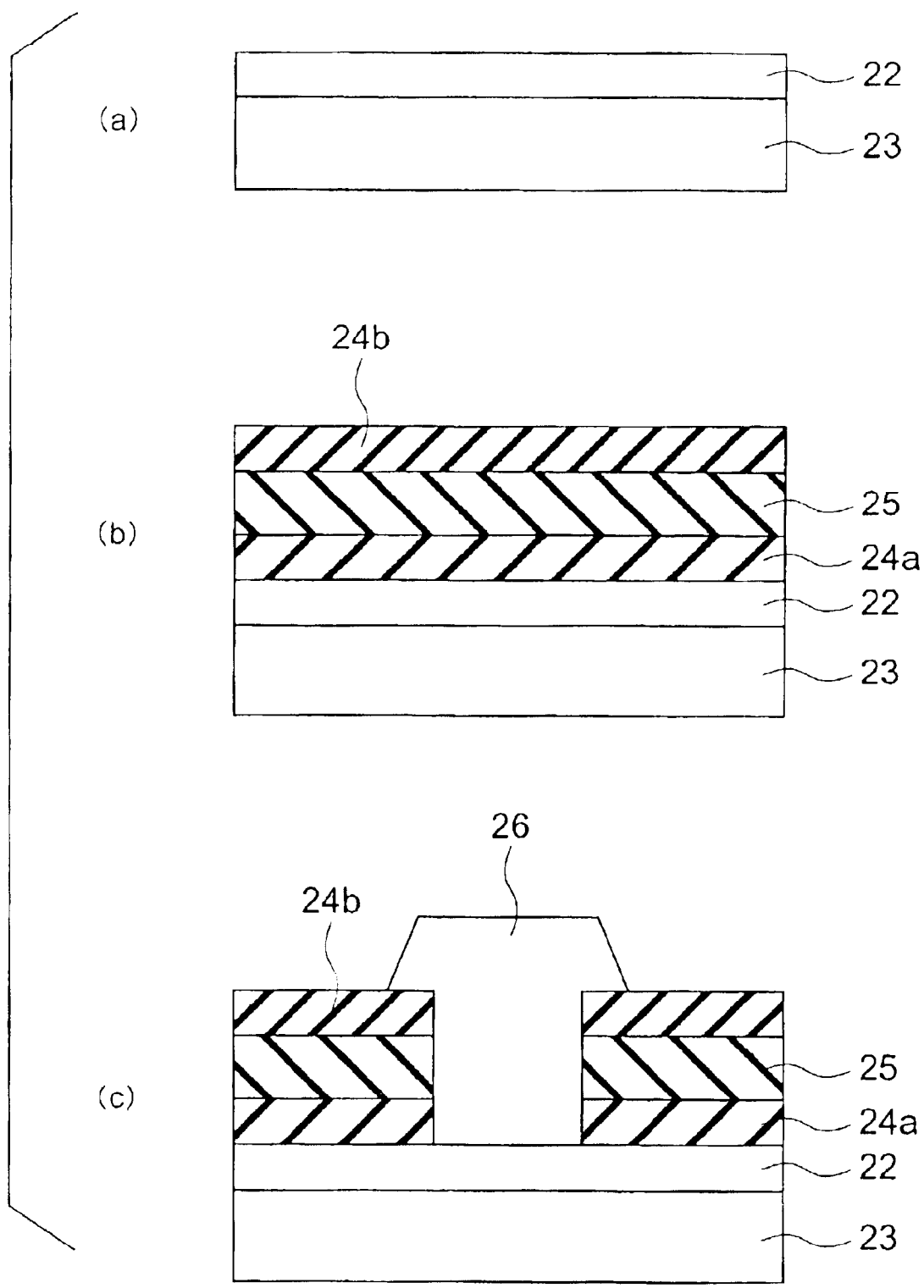
FIGS. 15(a) to 15(c) are sectional views showing manufacturing process of a method of manufacturing a semiconductor device according to the seventh embodiment of the present invention.
Figure 16:
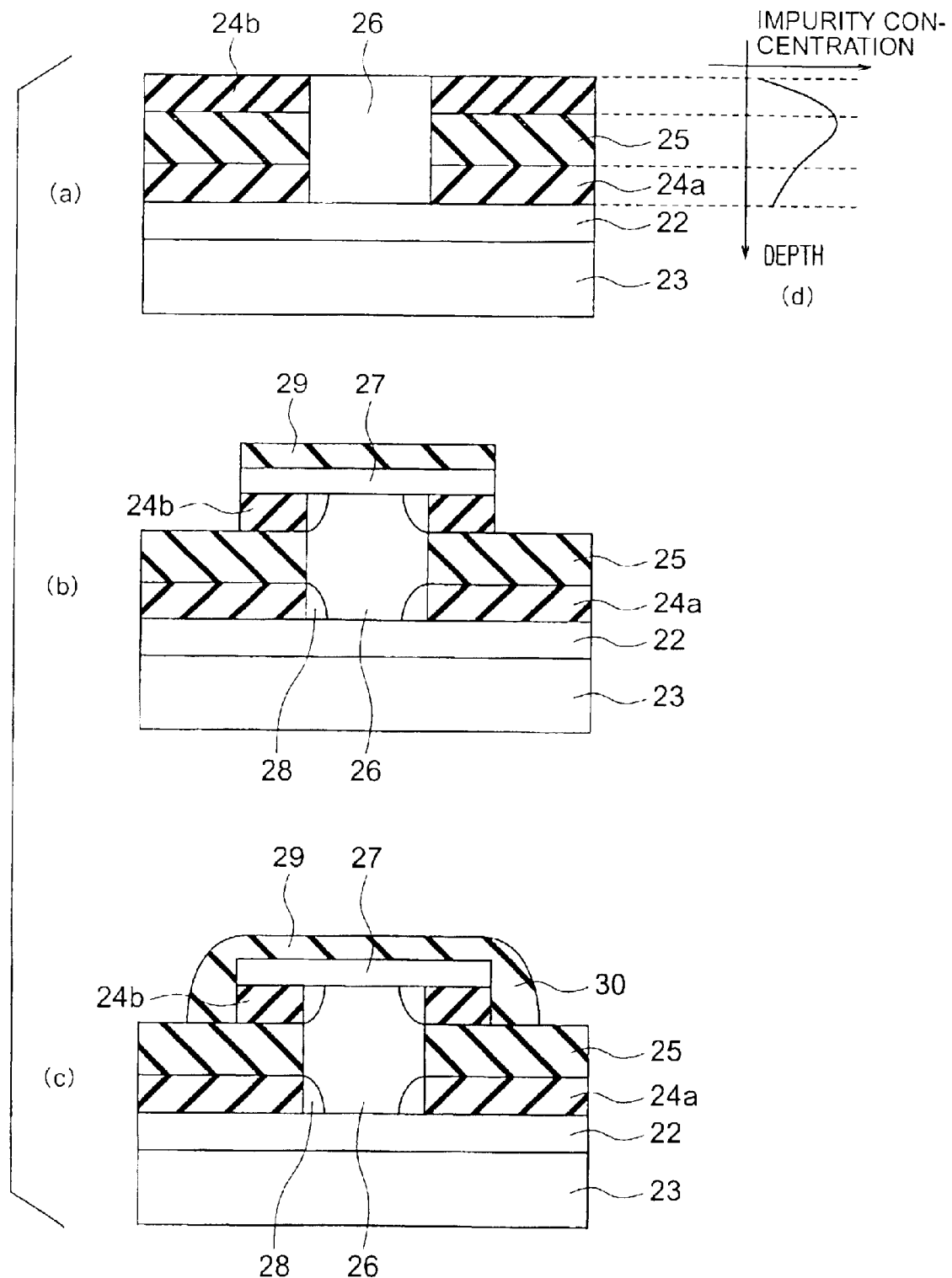
FIGS. 16(a) to 16(c) are sectional views showing manufacturing process of the method of manufacturing a semiconductor device according to the seventh embodiment of the present invention.
FIG. 16(d) shows the boron concentration profile of the oxide layer of the semiconductor device according to the seventh embodiment of the present invention.
Figure 17:
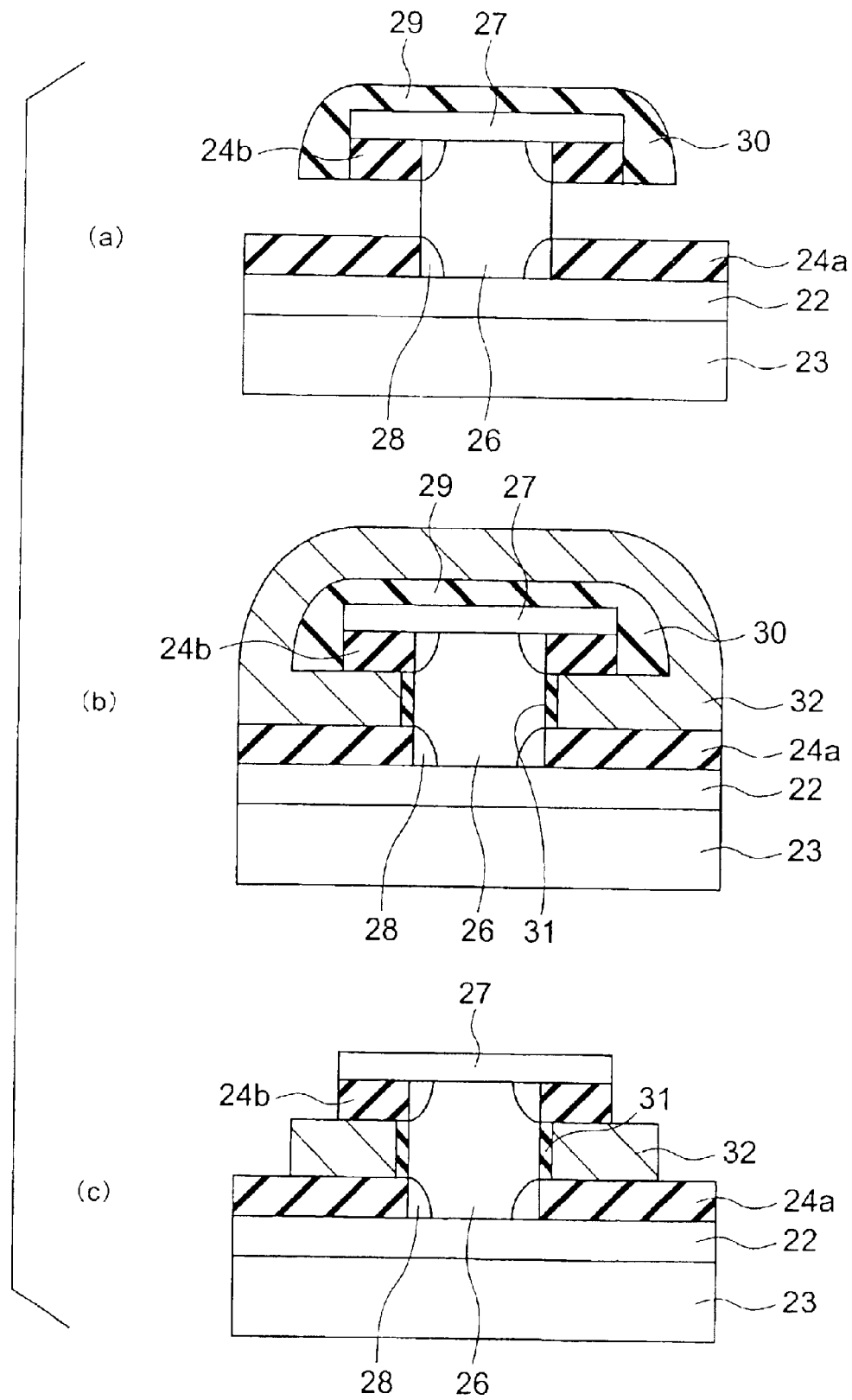
FIGS. 17(a) to 17(c) are sectional views showing manufacturing process of the method of manufacturing a semiconductor device according to the seventh embodiment of the present invention.

A semiconductor device according to a seventh embodiment of the present invention will be described with reference to FIGS. 14(a) to 14(c). Hereinafter, an example of a p-channel MISFET will be described. It should be noted, however, that this embodiment could be applied to an n-channel MISFET if the conduction types of substrate, channel, diffusion layer, and gate electrode is changed to the other types.

The semiconductor device in this embodiment includes a MISFET having a gate electrode of polycrystalline silicon-germanium. FIG. 14(a) shows the structure of the MISFET, FIG. 14(b) shows a graph of boron (B) and germanium (Ge) concentration distributions at the section taken along line A–A' in FIG. 14(a), and FIG. 14(c) is a graph of channel impurity concentration distribution.

The semiconductor device according to this embodiment includes a semiconductor region 26 of n-type silicon formed on a semiconductor substrate 23 by selective crystal growth, which semiconductor region 26 is isolated by a device isolation insulating layer (not shown), p-type diffusion layers 22 and 27 to serve as source/drain regions, which are formed over and below the semiconductor region 26, a p-type diffusion layer (hereinafter also referred to as "extension layer") 28 which is formed in the n-type semiconductor region 26 between the diffusion layers 22 and 27 and has a lower impurity concentration than the diffusion layers 22 and 27, a gate electrode 32 formed between the diffusion layers 22 and 27 so as to surround the semiconductor region 26 via a gate insulating layer 31, and insulating layers 24a and 24b formed over and below the gate electrode 32.

In the MISFET of this embodiment, the gate electrode 32 is formed of polycrystalline silicon-germanium, and boron (B) is implanted thereto to make it conductive. As shown in FIG. 14(b), the germanium concentration of the gate electrode 32 is continuously increased from the drain side to the source side. That is, in the gate electrode 32, a portion having a higher boron activating concentration and a higher germanium concentration is formed at the source side, and a portion having lower concentrations is formed at the drain side. As germanium activates p-type impurities (such as boron), the activating concentration of boron is continuously increased from the drain side to the source side. Further, as shown in FIG. 14(c), the impurity concentration distribution in the channel region, which determines the threshold value of the MISFET, is continuously increased from the source side to the drain side.

In addition, a source electrode and a drain electrode are formed in the source region 22 and the drain region 27, although they are not shown in the drawing.

As described above, in this embodiment, the germanium concentration is lower at the drain side than at the source side. Accordingly, the activating concentration of the impurity (boron) is higher at the source side than at the drain side. In conventional devices, the depletion in the gate electrode is more remarkable at the source side than at the drain side. However, in this embodiment, since the impurity activating concentration is higher at the source side, it is possible to inhibit the formation of depletion layer in the gate electrode 32, thereby preventing the reduction in effective gate capacitance due to the depletion layer capacitance. As a result, it is possible to inhibit the degradation of performance caused by the depletion in the gate electrode to the minimum. Further, in this embodiment, the germanium concentration in the gate electrode is lower at the drain side than at the source side. Accordingly, the impurity concentration in the channel region is continuously decreased from the drain side to the source side.

The threshold value of a p-type MISFET tends to increase as the germanium concentration in the gate electrode increases. However, it is possible to prevent the increase in threshold value by adjusting the impurity concentration distribution in the channel region in accordance with the germanium concentration of the gate electrode. Further, it is possible to prevent the formation of depletion layer in the diffusion layer at the drain side since the impurity concentration in the channel is increased from the source side to the drain side. As a result, it is possible to inhibit the short-channel effect, thereby inhibiting the degradation of performance even if the miniaturization of devices is carried out.

A method of manufacturing a semiconductor device of this embodiment will be described below. FIGS. 15(a) to 15(c), 16(a) to 16(c), and 17(a) to 17(c) show the process of manufacturing the semiconductor device of this embodiment contrived in consideration of the manufacturing process of a semiconductor device described in "International Electron Devices Meeting Technical Digest 2000", page 65. FIGS. 15(a) to 17(c) show the process of manufacturing a p-channel MISFET. If an n-channel MISFET should be manufactured, the conduction types of substrate, channel region, diffusion layer, and gate electrode should be changed to the other types.

First, as shown in FIG. 15(a), a diffusion layer 22 is formed by fist forming a device isolation region of an insulating material (not shown) in an n-type semiconductor substrate 23, and then implanting a p-type impurity into one of the isolated regions. The diffusion layer 22 serves as a source. Thereafter, an oxide layer containing boron (Boron Silicate Glass, which will be hereinafter referred to as "BSG") 24a, an oxide layer 25, and a BSG layer 24b are sequentially formed on the diffusion layer 22 (FIG. 15(b)). As will be described later, the oxide layer 25 will be removed and replaced by a gate electrode later. The thickness of the oxide layer 25 determines the gate length of the MISFET.

Next, as shown in FIG. 15(c), the BSG layers 24a and 24b and the oxide layer 25 are patterned by using the lithography technique and RIE (Reactive Ion Etching) method to expose a part of the diffusion layer 22. Then, the selective crystal growth of silicon is performed by using the exposed silicon portion as the seed, thereby forming a silicon layer 26. The crystal growth is continued until the thickness of the silicon layer 26 exceeds the sum of the thicknesses of the BSG layers 24a and 24b and the oxide layer 25.

Then, the silicon layer 26, which has been selectively crystal grown, is smoothed by CMP (Chemical Mechanical Polishing). Thereafter, an n-type impurity is implanted into the silicon layer 26 in order to adjust the threshold value to form a semiconductor region 26. At this time, the impurity is implanted in such a manner that the concentration distribution in the depth direction is at the maximum at the surface side, and becomes lower toward the diffusion layer 22. Subsequently, known anneal treatment with a fast thermal processing rate is performed to activate the implanted impurity (FIG. 16(a)).

Thereafter, a polycrystalline silicon layer and a silicon nitride layer 29 are sequentially deposited. Then, an n-type impurity is implanted into the polycrystalline silicon layer to form a diffusion layer 27. The diffusion layer 27 serves as a drain. The silicon nitride layer 29 and the diffusion layer 27 are processed by using the lithography technique and RIE method.

Subsequently, thermal treatment is performed to execute solid phase diffusion of boron of the BSG layers into the semiconductor region 26, thereby forming a diffusion layer (extension layer) 28 (FIG. 16(b)).

Then, a silicon nitride layer is deposited, and etched by using RIE method such that a part of the silicon nitride layer remains at the side portions of the diffusion layer 27 and the silicon nitride layer 29, thereby forming a sidewall 30 (FIG. 16(c)).

Next, the oxide layer 25 is removed by wet etching, thereby exposing the semiconductor region 26 (FIG. 17(a)).

Then, a gate insulating layer is formed on the surface of the exposed semiconductor region 26 by thermal oxidation method (FIG. 17(b)). Subsequently, a polycrystalline silicon-germanium layer 32 containing boron is deposited on the entire surface in such a manner that the germanium concentration is continuously increased from the lower portion of the channel region to the upper portion thereof. The deposition of the polycrystalline silicon-germanium layer 32 is continued until the sidewall 30 and the silicon nitride layer 29 are covered.

Subsequently, the polycrystalline silicon-germanium layer 32 is etched by RIE method using the silicon nitride layer 29 and the sidewall 30 as masks to expose the BSG layers 24a. Thereafter, the silicon nitride layer 29 and the sidewall 30 are removed by wet etching (FIG. 17(c)). Then, a salicide step to perform silicidation of only the portions where silicon is exposed is exposed by first depositing nickel, titan, or titanium nitride, then performing anneal treatment, and then removing unreacted metal layer by chemical treatment. Then, an insulating layer (not shown) is deposited, which is smoothed by CMP (Chemical Mechanical Polishing). Subsequently, a contact hole is formed through the insulating layer to the source 22 and the drain 27 by using the lithography technique. Then, a metal is filled in the contact hole to form source electrode and drain electrode (not shown), thereby completing the MISFET.

In the MISFET thus manufactured, the germanium concentration is higher at the source side than at the drain side, and the impurity activating concentration is higher at the source side than at the drain side. Accordingly, it is possible to prevent the formation of a depletion layer at the source side of the gate electrode, thereby preventing the reduction in effective gate capacitance due to the depletion layer capacitance. As a result, it is possible to inhibit the degradation of performance caused by the depletion in the gate electrode.

Further, since the impurity concentration in the channel region is continuously decreased from the drain side to the source side in accordance with the germanium concentration distribution in the gate electrode, it is possible to inhibit the increase in threshold value caused by the fluctuations of the band gap of the gate electrode.

In addition, since the impurity concentration in the channel region is increased from the source side to the drain side, it is possible to prevent the formation of depletion layer in the diffusion layer at the drain side. As a result, it is possible to inhibit the short-channel effect, thereby inhibiting the degradation of performance even if miniaturization of devices is carried out.

As described above, according to the present invention, it is possible to inhibit the degradation of performance even if miniaturization of devices is carried out.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
    a first conductive type semiconductor region formed in a semiconductor substrate;
    a gate electrode formed on said first conductive type semiconductor region;
    a channel region formed immediately below said gate electrode in said first conductive type semiconductor region; and
    a second conductive type first diffusion layer constituting source/drain regions formed at opposite sides of said channel region in said first conductive type semiconductor region,
    said gate electrode being formed of polycrystalline silicon-germanium, in which a germanium concentration is continuously increased from a drain region side to a source region side, and
    an impurity concentration immediately below said gate electrode in said first conductive type semiconductor region being continuously increased from the source region side to the drain region side in accordance with the germanium concentration in said gate electrode.

2. The semiconductor device according to claim 1, further comprising a second conductive type second diffusion layer formed between said source region and said channel region, and between said drain region and said channel region in said first conductive type semiconductor region, an impurity concentration of which is lower and a depth of which is shallower than those of said source region and said drain region.

3. The semiconductor device according to claim 1, further comprising a gate sidewall of an insulating material formed at a side portion of said gate electrode, wherein an oxide layer is formed between said gate sidewall and an edge of the gate electrode at the source region side.

4. A semiconductor device comprising:
    a first conductive type semiconductor portion formed on a semiconductor substrate;
    a gate electrode formed to surround a side portion of said first conductive type semiconductor portion;
    a channel region formed in said first conductive type semiconductor portion surrounded by said gate electrode; and
    source and drain layers formed to cover an upper surface and a lower surface of said first conductive type semiconductor portion,
    said gate electrode being formed of polycrystalline silicon-germanium, in which a germanium concentration is increased from a drain layer side to a source layer side, and
    an impurity concentration in said channel region being increased from the source layer side to the drain layer side.

5. The semiconductor device according to claim 4, wherein said source layer is formed between the lower surface of said first conductive type semiconductor portion and said semiconductor substrate, and said drain layer is formed over the upper surface of said first conductive type semiconductor portion.

6. The semiconductor device according to claim 4, wherein insulating layers are formed between said source layer and said gate electrode, and between said drain layer and said gate electrode so as to surround said first conductive type semiconductor portion.

7. The semiconductor device according to claim 6, further comprising second conductive type diffusion layers formed between said source layer and said channel region, and between said drain layer and said channel region in said first conductive type semiconductor portion, an impurity concentration of which is lower and a depth of which is shallower than those of said source layer and said drain layer.

8. A semiconductor device comprising:
    a first MISFET including:
        a first conductive type first semiconductor region formed in a semiconductor substrate;

a first gate electrode formed on said first conductive type first semiconductor region;

a first channel region formed immediately below said first gate electrode in said first conductive type first semiconductor region; and a second conductive type first diffusion layer constituting source/drain regions formed at opposite sides of said first channel region in said first conductive type first semiconductor region; and a second MISFET including:

a second conductive type second semiconductor region formed in the semiconductor substrate and isolated from said first conductive type first semiconductor region;

a second gate electrode formed on said second conductive type second semiconductor region;

a second channel region formed immediately below said second gate electrode in said second conductive type second semiconductor region; and a first conductive type second diffusion layer constituting source/drain regions formed at opposite sides of said second channel region in said second conductive type second semiconductor region, said first and second gate electrodes being formed of polycrystalline silicon-germanium, in which a germanium concentration is continuously increased from a drain region side to a source region side, an impurity concentration immediately below said first gate electrode in said first conductive type first semiconductor region being continuously increased from the source region side to the drain region side in accordance with the germanium concentration in said first gate electrode, and an impurity concentration immediately below said second gate electrode in said second conductive type second semiconductor region being continuously increased from the source region side to the drain region side in accordance with the germanium concentration in said second gate electrode.

9. The semiconductor device according to claim 8, further comprising:

a second conductive type third diffusion layer formed between said source region and said channel region and between said drain region and said channel region in said first conductive type first semiconductor region in said first MISFET, an impurity concentration of which is lower and a depth of which is shallower than those of said source region and said drain region; and a first conductive type fourth diffusion layer formed between said source region and said channel region and between said drain region and said channel region in said second conductive type second semiconductor region in said second MISFET, an impurity concentration of which is lower and a depth of which is shallower than those of said source region and said drain region.

10. The semiconductor device according to claim 8, wherein said first and second MISFETs include gate sidewalls of an insulating material formed at side portions of said first and second gate electrodes, and oxide layers are formed between said gate sidewalls and edges of said first and second gate electrodes at the source region sides.

* * * * *